(12) United States Patent
Toguchi et al.

(10) Patent No.: US 6,565,993 B2
(45) Date of Patent: May 20, 2003

(54) ORGANIC ELECTROLUMINESCENCE DEVICE

(75) Inventors: Satoru Toguchi, Tokyo (JP); Hitoshi Ishikawa, Tokyo (JP); Hiroshi Tada, Tokyo (JP); Yukiko Morioka, Tokyo (JP); Atsushi Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 24 days.

(21) Appl. No.: 09/732,715

(22) Filed: Dec. 11, 2000

(65) Prior Publication Data

US 2001/0003629 A1 Jun. 14, 2001

(30) Foreign Application Priority Data

Dec. 13, 1999 (JP) .............................. 11-353675

(51) Int. Cl.[7] .............................................. H05B 33/12
(52) U.S. Cl. ...................... 428/690; 428/212; 428/332; 428/917; 313/504; 313/506
(58) Field of Search ................. 428/690, 917, 428/212, 332; 313/502, 506, 504

(56) References Cited

U.S. PATENT DOCUMENTS

| | | | | |
|---|---|---|---|---|
| 5,281,489 A | * | 1/1994 | Mori et al. ................. | 428/690 |
| 5,294,810 A | * | 3/1994 | Egusa et al. .................. | 257/40 |
| 5,834,894 A | * | 11/1998 | Shirasaki et al. ........... | 313/509 |
| 6,010,796 A | * | 1/2000 | Kijima ........................ | 428/690 |
| 6,312,836 B1 | * | 11/2001 | Bulovic et al. ............. | 428/690 |

FOREIGN PATENT DOCUMENTS

| | | |
|---|---|---|
| JP | 7-138561 | 5/1995 |
| JP | 8-20771 | 1/1996 |
| JP | 8-31574 | 2/1996 |
| JP | 8-40995 | 2/1996 |
| JP | 8-40997 | 2/1996 |
| JP | 8-87122 | 4/1996 |
| JP | 8-222373 | 8/1996 |
| JP | 8-239655 | 9/1996 |
| JP | 2686418 | 8/1997 |
| JP | 10-88120 | 4/1998 |
| JP | 10-321376 | 12/1998 |
| JP | 2897138 | 3/1999 |
| JP | 11-273867 | 10/1999 |

* cited by examiner

*Primary Examiner*—Bruce H. Hess
*Assistant Examiner*—Dawn Garrett

(57) ABSTRACT

The present invention provides an organic EL device that allows the obtaining of favorable color emission with high efficiency. The organic EL device of the present invention has at least an emission layer 4 and an electron transporting layer 5 between an anode 2 and cathode 6, and an intermediate layer 7 is provided between the emission layer 4 and electron transporting layer 5 that has a film thickness of 1 to 20 nm and is comprised of a material having an ionization potential larger than that of the material used for the emission layer 4.

26 Claims, 5 Drawing Sheets

ORGANIC ELECTROLUMINESCENCE DEVICE

BACKGROUND OF THE INVENTION

1. Field of the Invention

The present invention relates to an organic electroluminescence (organic EL) device having excellent light-emitting properties.

2. Description of the Related Art

An organic electroluminescent device is a light-emitting device which makes use of the principle that when an electric field is applied, a fluorescent material emits light in response to the charger combination of holes injected from an anode and electrons injected from a cathode.

Since C. W. Tang et al. of Eastman Kodak Company made are port on a low-voltage-driven organic EL device using a double layer structure (C. W. Tang, S. A. Vanslyke, Applied Physics Letters, 51, 913(1987) and the like), studies on an organic EL device and materials have been briskly carried out.

Tang et al. applied tris(8-hydroxyquinolinol aluminum) to an emission layer and a triphenyldiamine derivative to a hole-transporting layer of multi-layered EL device. This stacked structure is accompanied with such advantages as an improvement in the injection efficiency of holes into the emission layer; blocking of electrons injected from a cathode, which increase the efficiency of exciton production from charge recombination; and confine of the excitons into the emission layer. As described above, a double layered structure composed of a hole-injecting and transporting layer and an electron-transporting and emission layer or a triple layered structure composed of a hole-injecting and transporting layer, a emission layer and an electron-injecting and transporting layer is well known as an organic EL device. In order to increase the recombination efficiency of injected holes and electrons, various improvements in the device structure or fabrication process have been introduced to such multi-layered devices.

As a hole-transporting material, triphenylaminederivatives such as 4,4',4"-tris(3-methylphenylphenylamino) triphenylamine and aromatic diamine derivatives such as N,N'-diphenyl-N,N'-bis(3-methylphenyl)-[1,1'-biphenyl]-4, 4'-diamine, which are starburst molecules, are well known (e.g., Japanese Unexamined Patent Application, First Publication Nos. 8-20771, 8-40995, 8-40997, 8-53397 and 8-87122).

As an electron-transporting material, oxadiazole derivatives, triazole derivatives and the like are well known.

As a light-emitting material, known are chelate complexes such as tris(8-quinolinolate)aluminum complex, coumarin derivatives, tetraphenylbutadienederivatives, bis-styrylarylene derivatives, oxadiazole derivatives and the like. Since these light-emitting materials can emit various color luminescences in a visible region from blue to red, there increased expectation for industrialization of a full color organic EL device (e.g. Japanese Unexamined Patent Application, First Publication Nos. 8-239655, 7-138561, 3-200889 and the like).

SUMMARY OF THE INVENTION

Organic EL device shaving high brightness and high efficiency have been disclosed or reported in recent years. However, in the many cases of organic EL devices having high brightness and high efficiency, the light emitted from materials in not only the emission layer but also the electron transporting layer are observed and that makes hard to get an organic EL device with pure color, especially pure emission.

Accordingly, the object of the present invention is to provide an organic EL device having high luminous efficiency as well as pure color light emission.

For the purpose of suppression light emission from the material in the electron transporting layer, the layer fabricated between the emission layer and the electron transporting layer to prevent injection of holes from emission layer to electron transporting layer and dispersion of excitons formed at the interface is considered to be more effective the greater the film thickness.

However, the inventors of the present invention found that, although emission from the material in the electron transporting layer is not observed in the case of a device comprising a intermediate layer using a material with an ionization potential larger than that of the material used for the emission layer and having thickness of 1 to 20 nm between the emission layer and the electron transporting layer, light emission from the material in the electron transporting layer is not suppressed not only in the case in which the film thickness of the intermediate layer is less than 1 nm, but also in the case the film thickness exceeds 20 nm, thereby leading to completion of the present invention.

In addition, if the materials in the emission layer, electron transporting layer and intermediate layer are typical semiconductors, hole injection from the emission layer into the electron transport layer is suppressed when the relationship of ionization potentials of materials is $Ip1<Ip2<Ip3$, wherein $Ip1$, $Ip2$ and $Ip3$ represent the ionization potentials of materials used for the emission layer, electron transporting layer and intermediate layer, respectively, and promoted when their relationship is $Ip1<Ip3<Ip2$. In the latter case, this is considered that the light emission from a material in electron transporting layer caused by carrier recombination in the electron transporting layer should increase. In the case of an organic EL in which the film thickness of an intermediate layer fabricated between an emission layer and electron transporting layer is 25 nm, increase of light emission from the material in the electron transporting layer was observed when the relationship is $Ip1<Ip3<Ip2$, actually.

However, the inventors of the present invention found that light emission from the electron transporting layer is suppressed in the case the film thickness of an intermediate layer is 1 to 20 nm, relationship of ionization potentials is $Ip1<Ip3<Ip2$.

Moreover, the inventors of the present invention found that an above-mentioned organic EL device with the emission layer in contact to anode perform emission with deeper color.

An organic EL device according to the present invention comprises at least an emission layer and an electron transporting layer between an anode and a cathode and has an intermediate layer that has a film thickness of 1 to 20 nm and is made of a material having a larger ionization potential than that of the material used for the emission layer.

In addition, the material that forms the above described intermediate layer may have an ionization potential that is smaller than that of the material used for the electron transporting layer.

In addition, the above emission layer is preferably adjacent to the anode.

The organic EL device according to the present invention has an intermediate layer that has a film thickness of 1 to 20 nm and is made of a material having a larger ionization potential than that of the material used for the emission layer and the device emits light with deep color highly effectively.

In addition, even if the material that forms the above intermediate layer has a smaller ionization potential than that of the material used for the electron transporting layer, the device still emits light with deep color highly effectively.

In addition, if the above emission layer is adjacent to an anode, the device emits light with deeper color.

DETAILED DESCRIPTION OF THE PREFERRED EMBODIMENTS

The following provides a detailed explanation of the present invention.

The organic EL device according to the present invention has a plurality of organic layers, including at least an emission layer and an electron transporting layer, between an anode and a cathode, and there are no particular on its structure having an intermediate layer, comprising a material having a specific film thickness and specific ionization potential, between an emission layer and electron transport layer.

Figure 1:
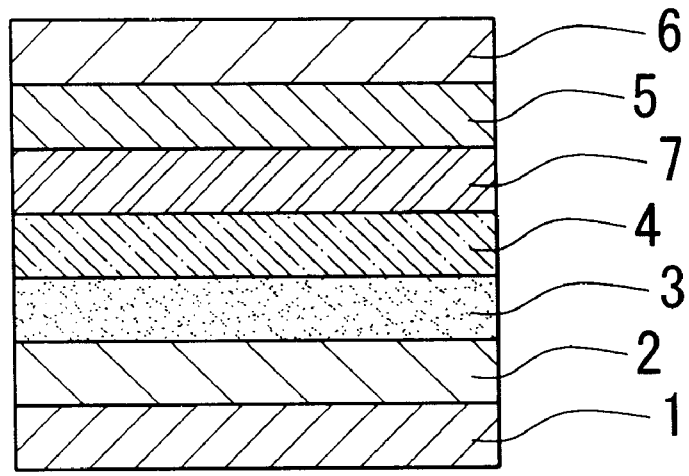
FIG. 1 is a cross-sectional view showing one example of an organic electroluminescence device of the present invention.
Figure 2:
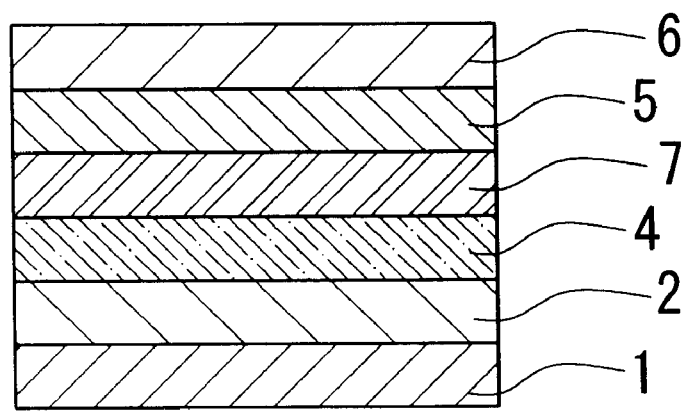
FIG. 2 is a cross-sectional view showing another example of an organic electroluminescence device of the present invention.

Examples of an organic EL device of the present invention include, for example, that having a multi-layer structure comprised of a substrate 1, an anode 2, a positive hole transporting layer 3, an emission layer 4, an intermediate layer 7, an electron transport layer 5 and a cathode 6 as shown in FIG. 1, or that having a multi-layer structure comprised of a substrate 1, an anode 2, an emission layer 4, an intermediate layer 7, an electron transport layer 5 and a cathode 6 as shown in FIG. 2. In particular, an organic EL device having a multi-layer structure in which an emission layer 4 is adjacent to an anode 2 as shown in FIG. 2 is preferable because it allows the obtaining of light emission having a deeper color.

In addition, a thin film layer comprising an inorganic derivative such as lithium fluoride, magnesium fluoride, silicon oxide, silicon dioxide or silicon nitride, a layer comprising a mixture of an organic material and an electrode material or metal, and an organic polymer thin film such as that comprised of polyaniline, polyacetylene derivative, polydiacetylene derivative, polyvinylcarbazole derivative, polyparapheneylenevinylene derivative may be inserted other than between emission layer 4, intermediate layer 7 and electron transport layer 5 for the purpose of improving charge injection characteristics and emission efficiency and suppression of insulation breakdown.

There are no particular limitation on the light emitting material used for the emission layer 4 in the present invention, and any compound that is normally used as alight emitting material may be used. Examples of light emitting material that can be used include low molecular weight light emitting materials such as tris(8-quinolinol) aluminum complex (Alq3) (Chemical Formula [1]), bisdiphenylvinylbiphenyl (BDPVBi) (Chemical Formula [2]),1,3-bis(p-t-butylphenyl-1,3,4-oxadiazolyl)phenyl (OXD-7) (Chemical Formula [3]), N,N'-bis(2,5-di-t-butylphenyl) perylenetetracarboxydiimide (BPPC)(Chemical Formula [4]) and 1,4-bis(N-p-tolyl-N-4-(4-methylstyryl) phenylamino)naphthalene (Chemical Formula [5]) shown below, as well as polymer light emitting materials such aspolyphenylenevinylene polymer.

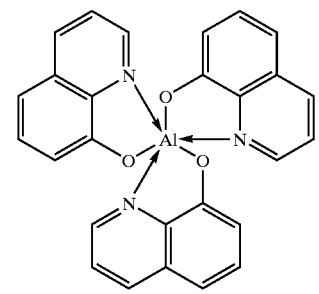

[1]

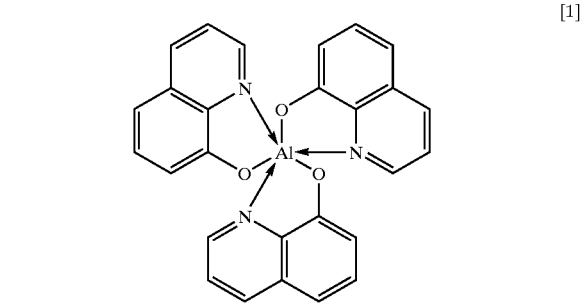

[2]

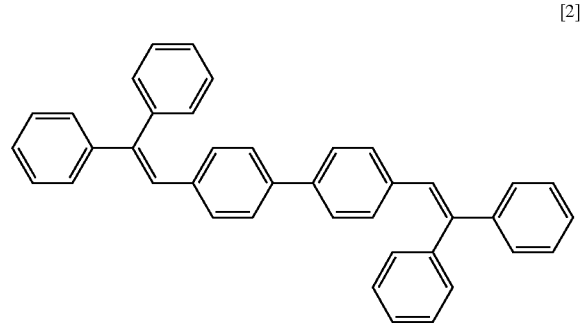

[3]

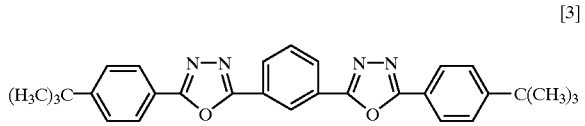

[4]

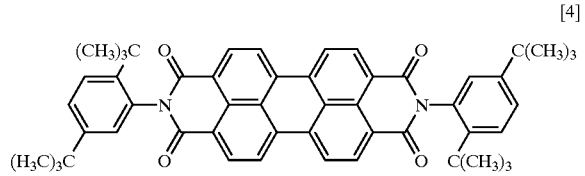

[5]

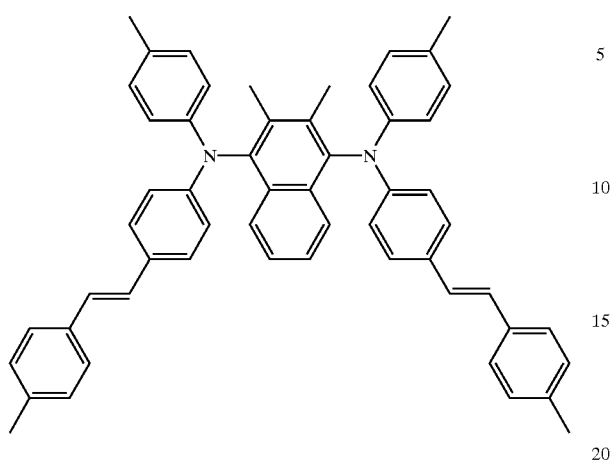

[8]

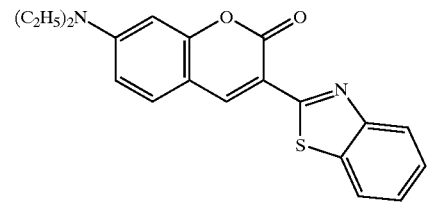

[9]

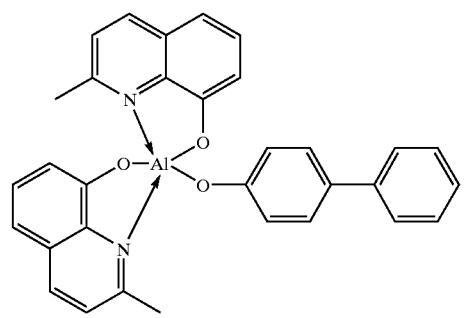

In addition, a mixture in which a charge transporting material is doped with a fluorescent material can also be used as a light emitting material. For example, a layer in which a quinolinol metal complex such as the above Alq3 (Chemical Formula [1]) is doped with a quinacridone derivative such as 4-diamninomethylene-2-methyl-6-(p-dimethylaminostyryl)-4H-pyrane (DCM) (Chemical Formula [6]) or 2,3-quinacridone (Chemical Formula [7]) or a coumarin derivative such as 3-(2'-benzothiazole)-7-diethylamninocoumarin (Chemical Formula [8]), a layer in which the electron transport material bis(2-methyl-8-hydroxyquinoline)-4-phenylphenol-aluminum complex (Chemical Formula [9]) is doped with a condensed polycyclic aromatic such as perylene(Chemical Formula [10]), or a layer in which the positive hole transport material 4,4'-bis (m-tolylphenylamino)biphenyl (TPD) (Chemical Formula [11]) is doped with rubrene, etc. can be used.

[10]

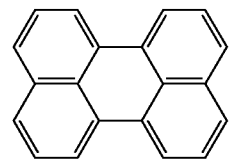

[11]

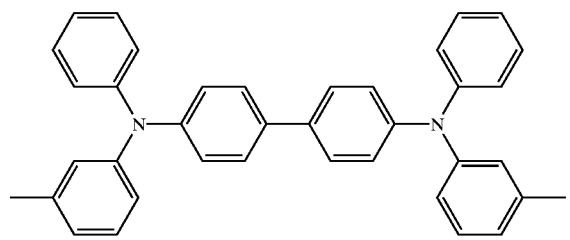

[6]

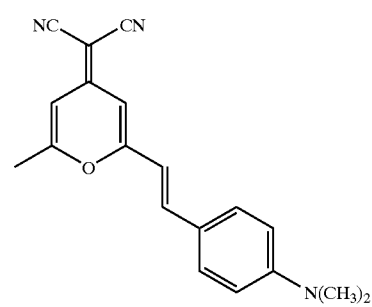

[12]

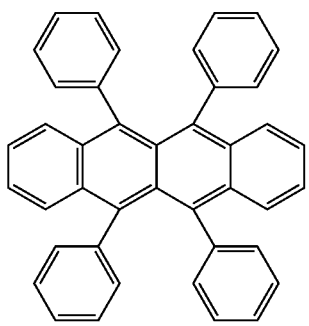

[7]

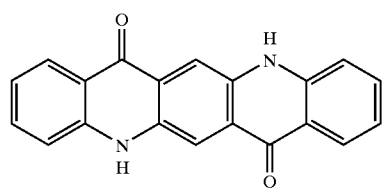

There are no particular limitation on the positive hole transporting material used for the positive hole transporting layer 3 in the present invention, and any compound that is normally used as a positive hole transporting material may be used. Examples of positive hole transporting materials include triphenyldiamines such as bis(di(p-tolyl) aminophenyl)-1,1-cyclohexane (Chemical Formula [13]), TPD(Chemical Formula [11]) and N,N'-diphenyl-N-N-bis (1-napthyl)-1,1'-biphenyl)-4,4'-diamine (NPB) (Chemical Formula [14]), and star burst molecules (such as Chemical Formula [15] to Chemical Formula [17]).

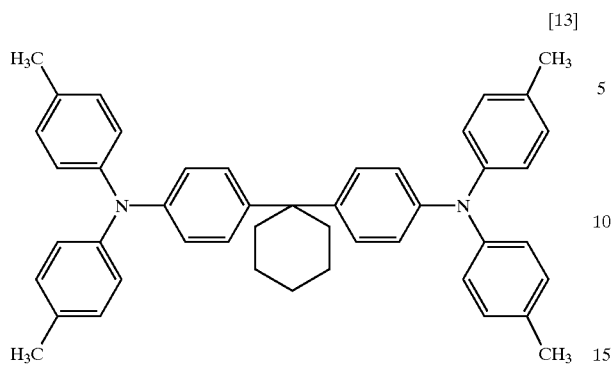

[13]

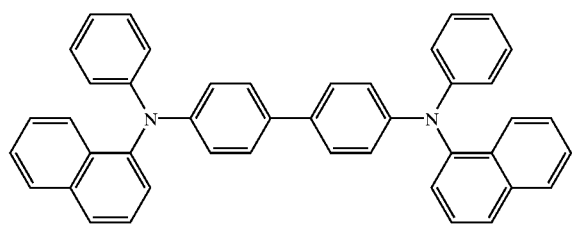

[14]

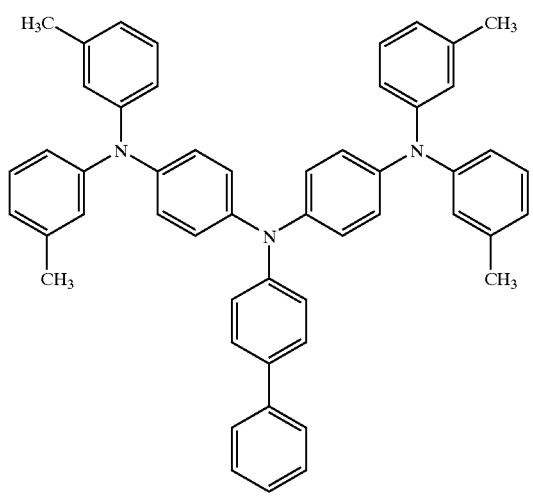

[15]

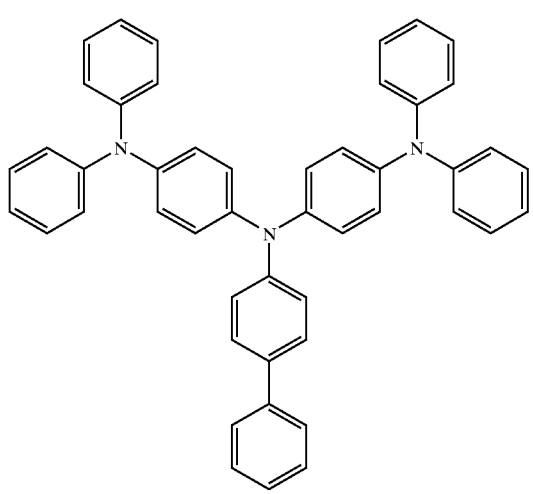

[16]

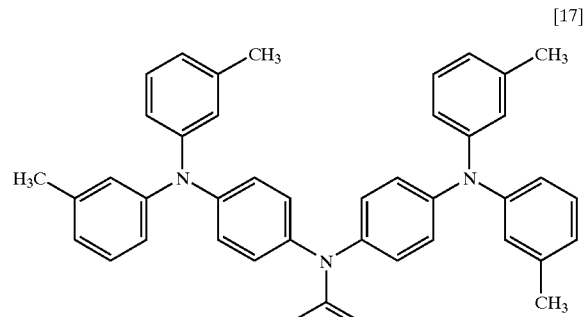

[17]

There is no particular limitation on the electron transporting material used for the electron transporting layer 5 in the present invention, and any compound that it is normally used as an electron transporting material can be used. Examples of electron transporting materials include oxadiazole derivatives such as 2-(4-biphenylyl)-5-(4-t-butylphenyl)-1,3,4-oxadiazole (Bu-PBD) [18] and OXD-7 (Chemical Formula [3]), triazole derivatives (such as (Chemical Formulas [19] and [20]), and quinolinol metal complexes (such as Chemical Formulas [1], [9] and [21] through [24]).

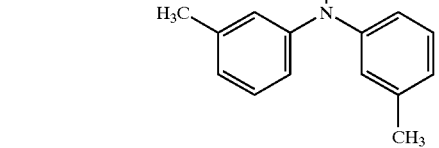

[18]

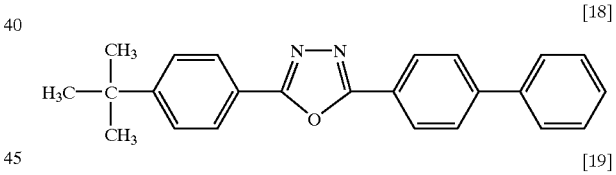

[19]

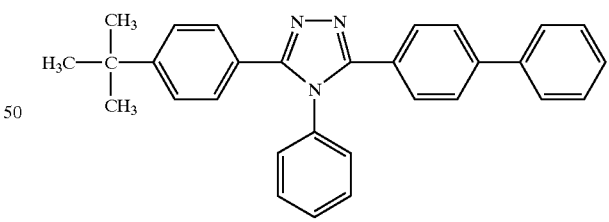

[20]

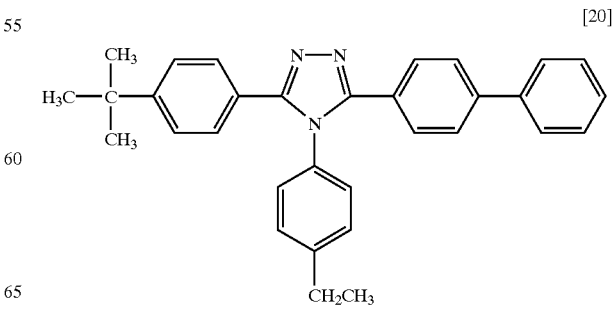

-continued

[21]
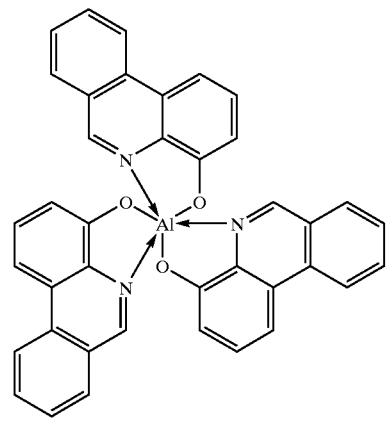

[22]
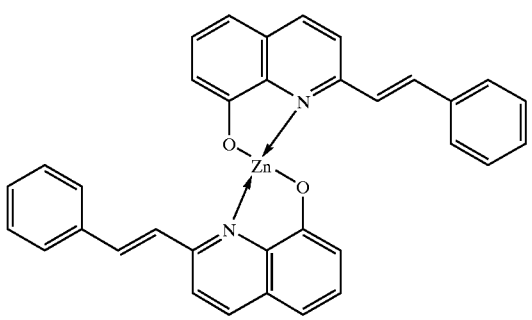

[23]
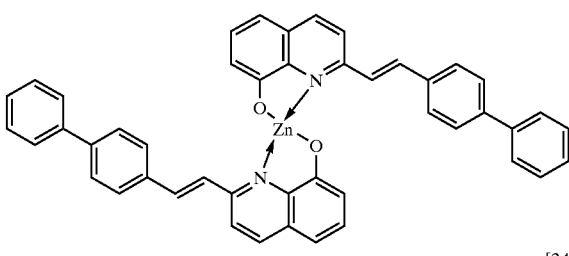

[24]
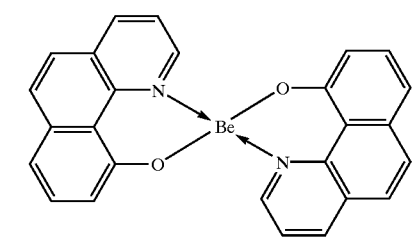

Any compound can be used for the material used in the intermediate layer 7 in the present invention provided that it has an ionization potential larger than that of the material used for the emission layer 4.

There is no particular limitation on the film thickness of the intermediate layer 7 provided that it is within the range of 1 to 20 nm. If the film thickness of the intermediate layer 7 is less than 1 nm, it is not effective in blocking positive holes. If the film thickness of intermediate layer 7 exceeds 20 nm, light emitted from the material used for electron transport layer 6 is observed which has a detrimental effect on emission efficiency and the emitted color.

In the view point of only the positive hole blocking effect, a material having a larger ionization potential than that of the material used for electron transport layer 5 is thought to be suitable for the material used for intermediate layer 7. In actuality, however, a material having an ionization potential smaller than that of the material used for electron transport layer 5 also acts effectively provided that its film thickness is within the film thickness range described above.

The anode 2 of the organic EL device plays a role of injecting holes into the hole-transporting layer and that having a work function of 4.5 eV or greater is effective. Specific examples of the anode material to be used for the organic EL device of the present invention include an indiumtin oxide (ITO), tin oxide (NESA), gold, silver, platinum and copper.

For the purpose of injecting electrons into the electron-transporting layer 5, the cathode having a smaller work function is preferred. Although there is no particular limitation imposed on the cathode material, specific examples include indium, aluminum, magnesium, magnesium-indium alloy, magnesium-aluminum alloy, aluminum-lithium alloy, aluminum-scandium-lithium alloy and magnesium-silver alloy.

There is no particular limitation on the forming method of each layer in the organic EL device of the present invention. Known methods in the prior art such as vacuum deposition, molecular beam epitaxy (MBE) or dipping, spin coating, casting, bar coating or roll coating of a solution in which said compounds are dissolved in a solvent can be used for the forming method of each layer.

Although there is no particular limitation on the film thickness of the emission layer 4, the positive hole transporting layer 3 and the electron transporting layer 5 of the organic EL device in the present invention, when the film is too thin, defects such as pinholes tend to occur. When the film is too thick, on the other hand, a high-applied voltage is required, which tends to deteriorate the efficiency. Usually, the organic layers are therefore preferred to have a film thickness within a range of several nm to 1 $\mu$m. The present invention will herein after be described in detail with reference to examples, but it should however be borne in mind that the present invention is not limited only to the following examples so long as they do not depart from the spirit or scope of the invention.

The ionization potentials of the emission layer, the electron transporting layer and the intermediate layer used in the following comparative examples and examples are shown in Table 1. Measurements were performed with the Riken Keiki AC-1.

TABLE 1

| | Material | Ionization potential (eV) |
|---|---|---|
| Emission layer | Chemical Formula [5] | 5.1 |
| Electron transport layer | Chemical Formula [1] | 5.8 |
| | Chemical Formula [14] | 5.4 |
| | Chemical Formula [19] | 5.8 |
| Intermediate layer | bathocuproine | 6.5 |
| | IDE-120 | 5.5 |
| | IDE-110 | 5.7 |

"IDE-110" and "IDE-120" are trade marks, sold by Idemitsu Kosan Co. Ltd.

"IDE-110" and "IDE-120" (both are substituted or unsubstituted bis(2,2-diphenylvinyl)-polyarylene) are trademarks, sold by Idemitsu Kosan Co., Ltd.

Comparative Example 1

The following provides an explanation of the production procedure of an organic EL device used in Comparative Example 1. This organic EL device is composed of a substrate, an emission layer, and an electron transporting layer and cathode.

To begin with, an ITO was sputtered on glass substrate 1 measuring 50 mm×25 mm ("NA45, 1.1 mm thick" trade mark sold by HOYA CORP.) to form a film having a sheet resistance of 20 ohm/□as anode 2. The 1,4-bis(N-p-tolyl-N-4-(4-methylstyryl)phenylamino)naphthalene (Chemical Formula [5]) was then vacuum deposited on this anode to form an emission layer having a film thickness of 60 nm. Next, (Alq$_3$) (Chemical Formula [1]) was vacuum deposited on the emission layer to form an electron transporting layer having a film thickness of 25 nm. Next, magnesium-silver alloy was vacuum deposited on the electron transporting layer to form a cathode having a film thickness of 200 nm and produce the organic EL device.

Figure 3:
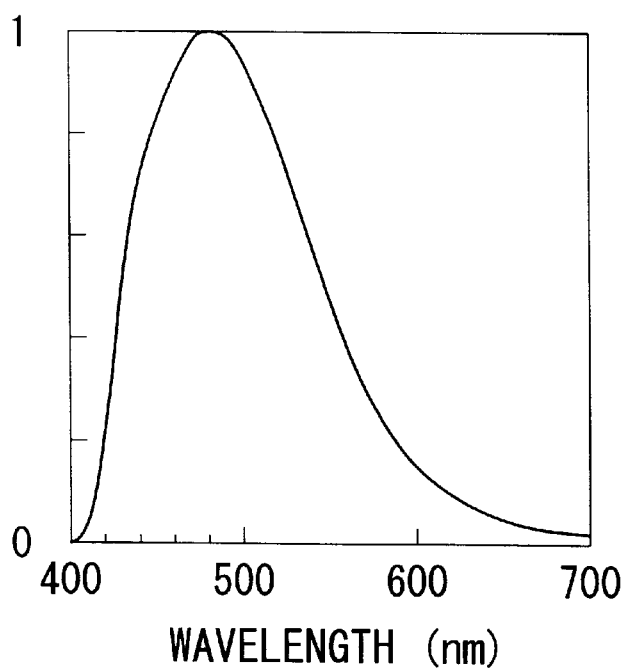
FIG. 3 shows an EL spectrum of a device of Comparative Example 1.

When a dc voltage of 7 V was applied to this organic EL device, light emission of 340 cd/m$^2$ was obtained. The emission spectrum at this time is shown in FIG. 3.

EXAMPLE 1

The following provides an explanation of the production procedure of an organic EL device used in Example 1. This organic EL device has the cross-sectional structure shown in FIG. 2.

To begin with, an ITO film was sputtered on glass substrate 1 measuring 50 mm×25 mm (Hoya, NA45, 1.1 mm thick) to form a film having a sheet resistance of 20 ohm/□as anode. The 1,4-bis(N-p-tolyl-N4-(4-methylstyryl) phenylamino)naphthalene (Chemical Formula [5]) was vacuum deposited on the anode to form an emission layer having a film thickness of 60 nm. Next, NBP (Chemical Formula [14]) was vacuum deposited on the emission layer to form an intermediate layer having a film thickness of 5 nm. Next, (—Alq$_3$—) (Chemical Formula [1]) was vacuum deposited on the intermediate layer to form an electron transporting layer having a film thickness of 25 nm. Next, a magnesium-silver alloy was vacuum deposited on the electron transporting layer to form a cathode having a film thickness of 200 nm and produces the organic EL device.

Figure 4:
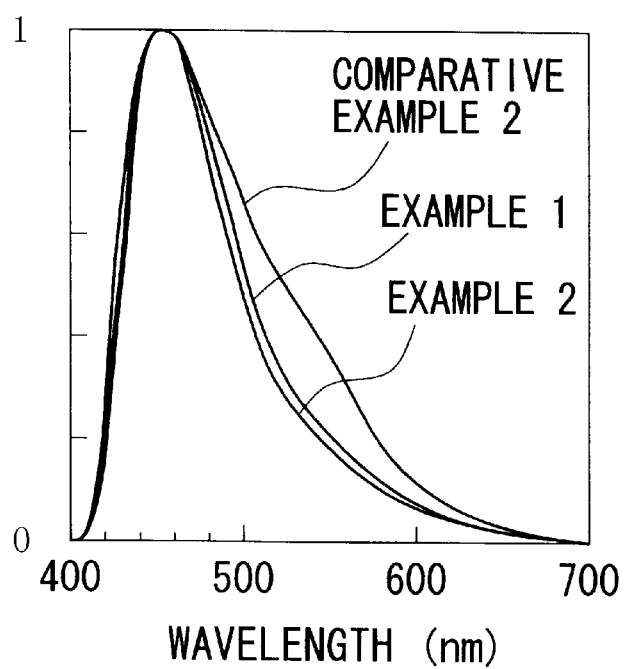
FIG. 4 shows an EL spectrum of devices of Embodiments 1 and 2 and Comparative Example 2.
Figure 5:
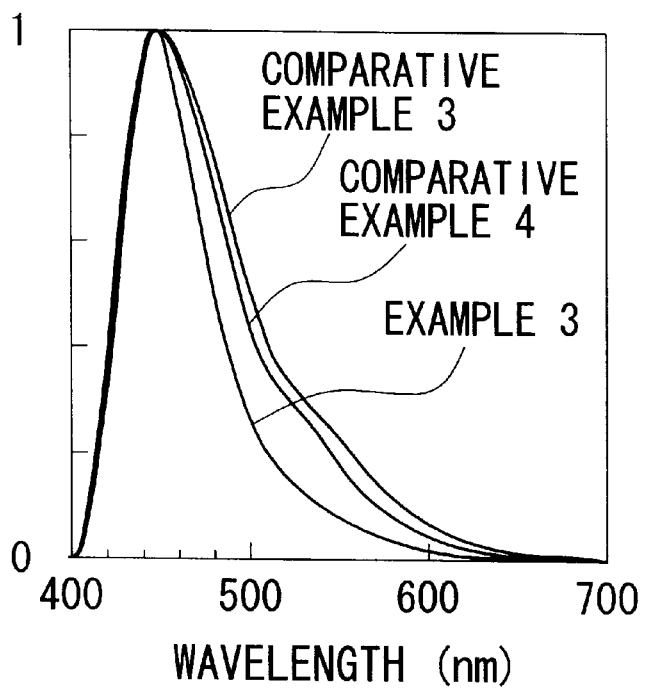
FIG. 5 shows an EL spectrum devices of Embodiment 3 and Comparative Examples 3 and 4.
Figure 6:
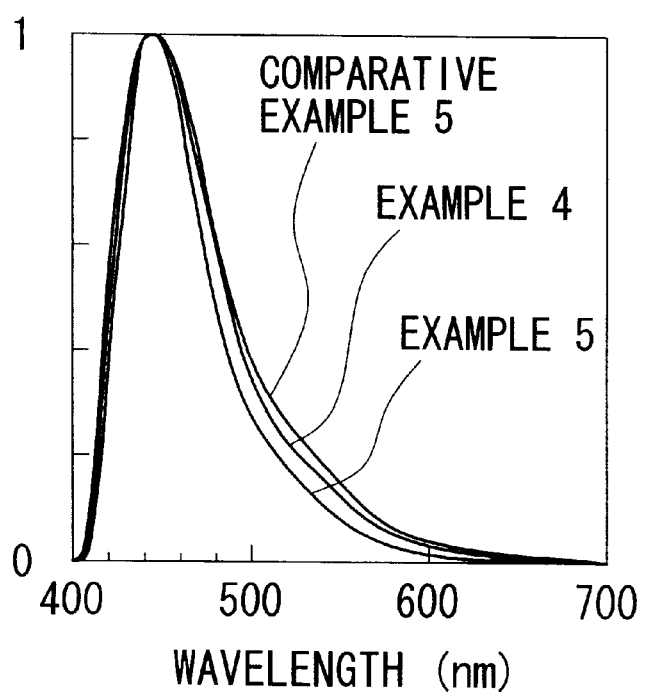
FIG. 6 shows an EL spectrum of devices of Embodiments 4 and 5 and Comparative Example 5.
Figure 7:
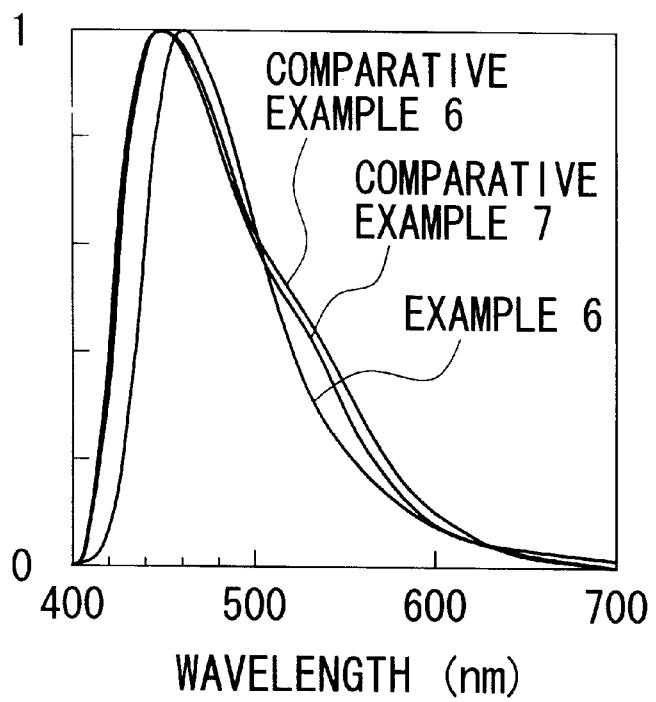
FIG. 7 shows an EL spectrum of devices of Embodiment 6 and Comparative Examples 6 and 7.
Figure 8:
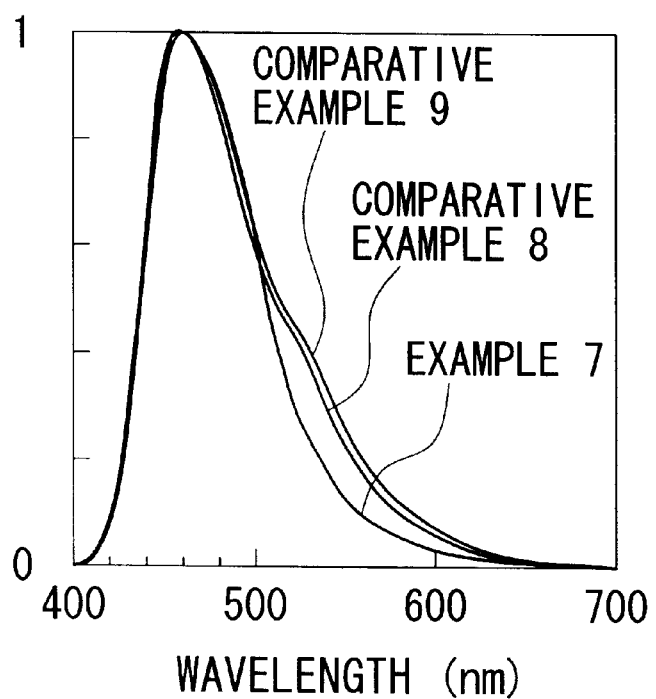
FIG. 8 shows an EL spectrum of devices of Embodiment 7 and Comparative Examples 8 and 9.

When a dc voltage of 7 V was applied to this organic EL device, light emission of 400 cd/m$^2$ was obtained. The emission spectrum at this time is shown in FIG. 4.

EXAMPLES 2–7 and

Comparative Examples 2–9

With the exception of a different film thickness of the intermediate layer and the use of a different material, organic EL devices were produced in the same manner as Example 1. The materials used for the intermediate layer in each example and comparative example, the film thickness of the intermediate layer, and the emission brightness of the produced organic EL devices are shown in Table 2, while the emission spectra are shown in FIGS. 4 through 8.

TABLE 2

| | Intermediate layer material | Intermediate layer film thickness (nm) | Emission brightness (cd/m$^2$) (drive voltage (v)) | Emission spectrum |
|---|---|---|---|---|
| Ex. 2 | Chemical Formula [14] | 15 | 330 (7) | FIG. 4 |
| Comp. Ex. 2 | Chemical Formula [14] | 25 | 410 (6.5) | FIG. 4 |
| Ex. 3 | Chemical Formula [19] | 9 | 310 (6) | FIG. 5 |
| Comp. Ex. 3 | Chemical Formula [19] | 23 | 410 (7.5) | FIG. 5 |
| Comp. Ex. 4 | Chemical Formula [19] | 0.5 | 330 (7) | FIG. 5 |
| Ex. 4 | bathocuproine | 3 | 210 (6) | FIG. 6 |
| Ex. 5 | bathocuproine | 16 | 350 (6) | FIG. 6 |
| Comp. Ex. 5 | bathocuproine | 26 | 540 (6) | FIG. 6 |
| Ex. 6 | IDE-110 | 5 | 270 (6) | FIG. 7 |
| Comp. Ex. 6 | IDE-110 | 22 | 394 (6) | FIG. 7 |
| Comp. Ex. 7 | IDE-110 | 0.6 | 320 (6) | FIG. 7 |
| Ex. 7 | IDE-120 | 12 | 340 (6) | FIG. 8 |
| Comp. Ex. 8 | IDE-120 | 23 | 170 (6) | FIG. 8 |
| Comp. Ex. 9 | IDE-120 | 0.5 | 310 (6) | FIG. 8 |

Figure 9:
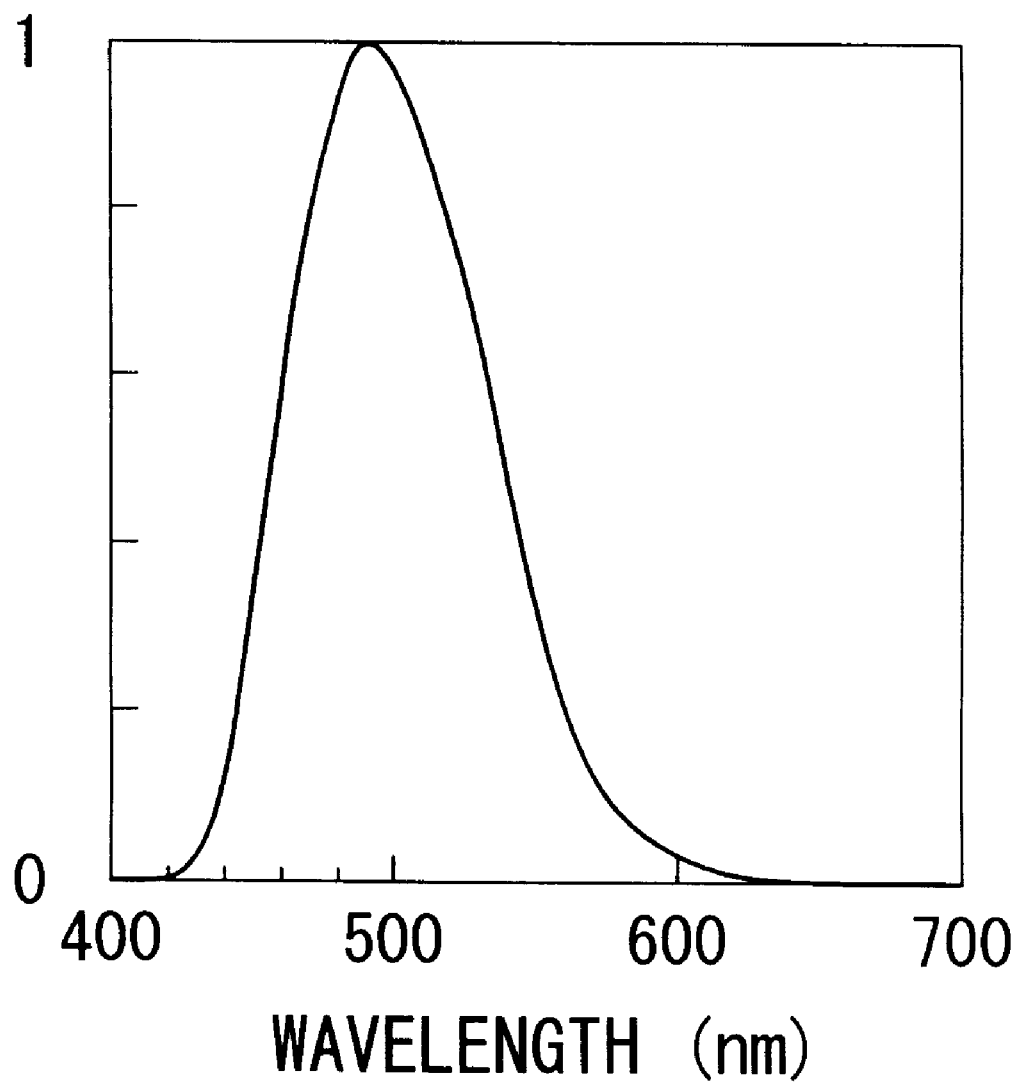
FIG. 9 shows a fluorescence spectrum of a chloroform solution of Compound [1].

The fluorescent spectrum of a chloroform solution of (Alq$_3$) (Chemical Formula [1]) is shown in FIG. 9. In the case that the film thickness of the intermediate layer is less than 1 nm (Comparative Examples 4, 7 and 9) or in exceeds 20 nm (Comparative Examples 2, 3, 5, 6 and 8), emission was observed in the vicinity of 500 nm in all cases. Judging from the emission wavelength, these emission are light emitted from (—Alq$_3$—) (Chemical Formula [1]) used for the electron transporting layer. Accordingly, these organic EL devices have impure color due to their broad emission spectra. On the other hand, in Examples 1–7 in which the film thickness of the intermediate layer was within the range of 1–20 nm, the emission at about 500 nm were not observed. Thus, Examples 1–7 can be understood to allow the obtaining of light emission of only 1,4-bis(N-p-tolyl-N-4-(4-methylstyrl)phenylamino)naphthalene (Chemical Formula [5]) with deeper color.

What is claimed is:

1. An organic electroluminescence device having an emission layer and an electron transporting layer between an anode and cathode, comprising:
    an intermediate layer having a film thickness of 1 to 20 nm formed between said emission layer and said electron transporting layer, said intermediate layer being comprised of a material having an ionization potential which is larger than that of said emission layer and smaller than that of said electron transporting layer.

2. An organic electroluminescence device according to claim 1, wherein said intermediate layer comprises at least one of N,N'-diphenyl-N-N-bis(1-napthyl)-1,1'-biphenyl)-4, 4'-diamine, bathocuproine, star burst molecules and bis(2, 2-diphenylvinyl)-polyarylene.

3. An organic electroluminescence device according to claim 1 wherein said emission layer is adjacent to the anode.

4. The organic electroluminescence device according to claim 1, wherein said intermediate layer has an emission brightness of 170–540 (cd/m$^2$).

5. The organic electroluminescence device according to claim 1, wherein said emission layer comprises at least one of tris(8-quinolinol)aluminum complex (Alq3), bisdephenylvinylbiphenyl (BDPVBi), 1,3-bis(p-t-butylphenyl-1,3,4-oxadiazolyl)phenyl (OXD-7), N,N'-bis(2,5-di-t-butylphenyl)perylenetetracarboxydiimide (BPPC), 1,4-bis (N-p-tolyl-N-4-(4-methylstyryl)phenylamino)naphthalene and aspolyphenylenevinylene polymer.

6. The organic electroluminescence device according to claim 1, wherein said emission layer comprises a charge transporting material and a fluorescent material.

7. The organic electroluminescence device according to claim 1, wherein said emission layer comprises a quinolinol metal complex and a quinacridone derivative.

8. The organic electroluminescence device according to claim 1, wherein said emission layer comprises a quinolinol metal complex and at least one of 4-diaminomethylene-2-methyl-6-(p-dimethyulaminostyryl)-4H-pyane (DCM), 2,3-quinacridone and a coumarin derivative.

9. The organic electroluminescence device according to claim 8, wherein said quinolinol metal complex comprises tris(8-quinolinol)aluminum complex (Alq3).

10. The organic electroluminescence device according to claim 8, wherein said coumarin derivative comprises at least 3-(2'-benzothiazole)-7-diethylaminocoumarin.

11. The organic electroluminescence device according to claim 1, wherein said electron transporting layer comprises at least one of a oxadiazole derivative, triazole derivatives and a quinolinol metal complex.

12. The organic electroluminescence device according to claim 1, wherein said oxadiazole derivative comprises at least one of 2-(4-biphenyl)-5-(4-t-butylphenyl)-1,3,4-oxadiazole (Bu-PBD) and 1,3-bis(p-t-butylphenyl-1,3,4-oxadiazolyl)phenyl (OXD-7).

13. The organic electroluminescence device according to claim 1, wherein said electron transporting layer comprises an electron transport material and a condensed polycyclic aromatic material.

14. The organic electroluminescence device according to claim 13, wherein said polycyclic aromatic material comprises at least perylene.

15. The organic electroluminescence device according to claim 13, wherein said electron transporting material comprises bis(2-methyl-8-hydroxyquinoline)-4-phenylphenol-aluminum complex.

16. The organic electroluminescence device according to claim 1, further comprising:
a positive hole transporting layer formed between said emission layer and said anode.

17. The organic electroluminescence device according to claim 1, wherein said film thickness of said intermediate layer is greater than about 10 nm and less than about 20 nm.

18. The organic electroluminescence device according to claim 1, wherein said intermediate layer suppresses light emissions from the electron transport layer.

19. The organic electroluminescence device according to claim 1, wherein said anode comprises at least one of indium tin oxide (ITO), tin oxide (NESA), gold, silver, platinum and copper.

20. The organic electroluminescence device according to claim 1, wherein said cathode comprises at least one of indium, aluminum, magnesium, magnesium-indium alloy, magnesium-aluminum alloy, aluminum-lithium alloy, aluminum-scandium-lithium alloy and magnesium-silver alloy.

21. The organic electroluminescence device according to claim 1, wherein said emission layer and electron transporting layer each have a film thickness in a range of more than 2 nm to 1 $\mu$m.

22. The organic electroluminescence device according to claim 1, wherein said intermediate layer has a film thickness of about 3 to 16 nm with an emission brightness of 210 to 350 cd/m$^2$.

23. An electroluminescence device having an emission layer and an electron transporting layer between an anode and cathode, and comprising:
an intermediate layer formed between said emission layer and said electron transporting layer, said intermediate layer being comprised of a material having an ionization potential which is larger than that of said emission layer and smaller than that of said electron transporting layer.

24. An electroluminescence device having an emission layer and an electron transporting layer between an anode and cathode, comprising:
an intermediate layer having a thickness of 1 to 20 nm and having an ionization potential less than that of said electron transporting layer and greater than that of said emission layer.

25. An electroluminescence device having an emission layer and an electron transporting layer between an anode and cathode, comprising:
an intermediate layer having a thickness of 1 to 20 nm and having an ionization potential so as to suppress a light emission from said electron transporting layer,
wherein said intermediate layer is comprised of a material having an ionization potential which is larger than that of said emission layer and smaller than that of said electron transporting layer.

26. The electroluminescence device of claim 2, wherein said starburst molecules comprise one of 4,4'-bis(N,N-di-m-tolyl-amino)-4"-phenyl-triphenylamine; 4,4'-bis(N,N-diphenylamino)-4"-phenyl-triphenylamine and 4,4', 4"-tris(N,N-di-m-tolyl-amino)-triphenylamine.

* * * * *